US008902999B2

(12) United States Patent  
Yang (10) Patent No.: US 8,902,999 B2  
(45) Date of Patent: Dec. 2, 2014

(54) ISOLATION INTERFACE CIRCUIT FOR POWER MANAGEMENT

(71) Applicant: Ta-Yung Yang, Milpitas, CA (US)

(72) Inventor: Ta-Yung Yang, Milpitas, CA (US)

(73) Assignee: System General Corp., Taipei (TW)

(*) Notice: Subject to any disclaimer, the term of this patent is extended or adjusted under 35 U.S.C. 154(b) by 100 days.

(21) Appl. No.: 13/682,741

(22) Filed: Nov. 21, 2012

(65) Prior Publication Data

US 2013/0127510 A1    May 23, 2013

Related U.S. Application Data

(60) Provisional application No. 61/563,072, filed on Nov. 23, 2011.

(51) Int. Cl.
| | |
|---|---|
| *H04L 25/00* | (2006.01) |
| *H04L 7/027* | (2006.01) |
| *H03K 3/00* | (2006.01) |
| *H04L 12/10* | (2006.01) |
| *H04L 25/02* | (2006.01) |

(52) U.S. Cl.  
CPC ......... *H03K 3/00* (2013.01); *H04L 12/10* (2013.01); *H04L 25/0272* (2013.01); *H04L 25/0266* (2013.01)  
USPC ............ 375/257; 375/215; 375/220; 375/219

(58) Field of Classification Search  
USPC .......... 375/219, 220, 222, 257, 258, 215, 362  
See application file for complete search history.

(56) References Cited

U.S. PATENT DOCUMENTS

| | | | | |
|---|---|---|---|---|
| 7,031,458 | B2* | 4/2006 | Holcombe et al. | 379/399.02 |
| 7,953,162 | B2* | 5/2011 | Shetty | 375/257 |
| 8,175,173 | B2* | 5/2012 | Shetty | 375/257 |
| 8,305,137 | B2* | 11/2012 | Kunc et al. | 327/560 |
| 8,442,100 | B2* | 5/2013 | Giombanco et al. | 375/220 |
| 8,478,332 | B2* | 7/2013 | Giombanco et al. | 455/550.1 |
| 8,576,930 | B2* | 11/2013 | Lombardo et al. | 375/258 |
| 2008/0117994 | A1* | 5/2008 | Shetty | 375/257 |
| 2012/0249334 | A1* | 10/2012 | Dao et al. | 340/636.1 |

* cited by examiner

*Primary Examiner* — Vibol Tan  
(74) *Attorney, Agent, or Firm* — Jianq Chyun IP Office (57) ABSTRACT

An isolation interface circuit is disclosed. The isolation interface circuit comprising a transmitting circuit and a receiving circuit. The transmitting circuit configured to receive a first serial interface signal and a second serial interface signal for generating a differential polarity pulse signal. The receiving circuit configured to receive the differential polarity pulse signal for generating the first serial interface signal and the second serial interface signal. The differential polarity pulse signal are generated in response to the first serial interface signal and the second serial interface signal. The first serial interface signal and the second serial interface signal are generated in accordance with the differential polarity pulse signal. In a period, only one of the transmitting circuit and the receiving circuit can be enabled.

14 Claims, 11 Drawing Sheets

ISOLATION INTERFACE CIRCUIT FOR POWER MANAGEMENT

CROSS-REFERENCE TO RELATED APPLICATION

This application claims the priority benefits of U.S. provisional application Ser. No. 61/563,072, filed on Nov. 23, 2011. The entirety of the above-mentioned patent application is hereby incorporated by reference herein and made a part of this specification.

BACKGROUND OF THE INVENTION

1. Field of the Invention

The present invention relates to devices for power management, and particularly relates to an isolation circuit for a power converter.

2. Background of the Invention

A smart bus is a popular interface circuit used in a power management device, similar with $I^2C$ interface, has been developed as a standard for the micro-controller's interface providing a simple and flexible serial interface circuit for the power management and control. However, a smart bus cannot be applied to a system having different ground levels. Therefore, how to provide an isolation interface circuit for power management, particularly for the system with different voltages and the ground levels is required.

SUMMARY OF THE INVENTION

The present invention provides an isolation interface circuit. The isolation interface circuit comprising a transmitting circuit and a receiving circuit. The transmitting circuit is configured to receive a first serial interface signal and a second serial interface signal for generating a differential polarity pulse signal. The receiving circuit is configured to receive the differential polarity pulse signal for generating the first serial interface signal and the second serial interface signal. The differential polarity pulse signal are generated in response to the first serial interface signal and the second serial interface signal. The first serial interface signal and the second serial interface signal are generated in accordance with the differential polarity pulse signal. In a period, only one of the transmitting circuit and the receiving circuit can be enabled.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DETAILED DESCRIPTION OF EMBODIMENTS

Figure 1:
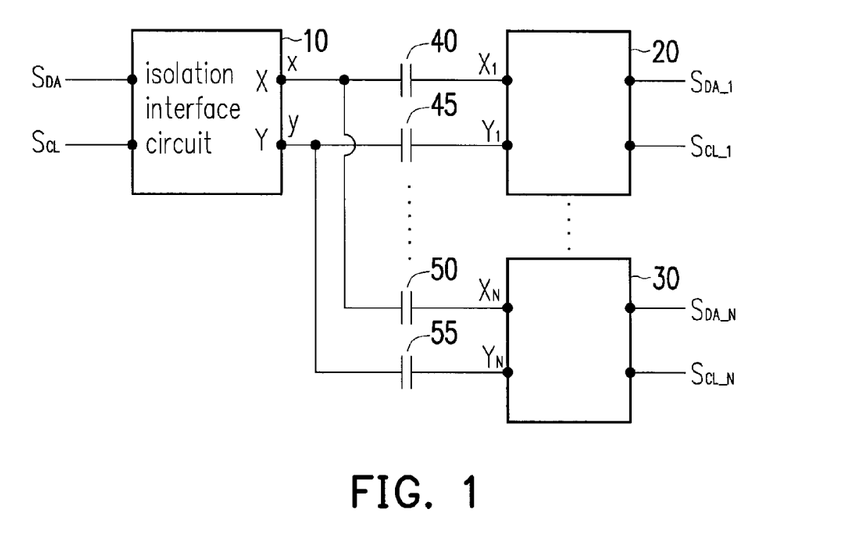
FIG. 1 shows a schematic view illustrating a first embodiment of an isolation interface circuit for power management according to the present invention.

FIG. 1 shows a schematic view illustrating a first embodiment of an isolation interface circuit for power management according to the present invention. An isolation interface circuit 10 is configured to receive/generate serial interface signals $S_{DA}$ and $S_{CL}$, and has terminals X and Y communicating with circuits 20 and 30. The signal $S_{DA}$ represents the data signal of the serial interface, and the signal $S_{CL}$ represents the clock signal of the serial interface. The output impedance of the terminals X, Y is low, but the input impedance of the terminals X, Y is high. Differential polarity pulse signals x and y are generated by the circuit 10 and are output from the terminals X and Y. Because the pulse width of the signals x and y is short, usually less than 300 nano seconds, the capacitance of the capacitors 40, 45 ... 50, 55 could be very small. The circuits 20 and 30 are further coupled to signals $S_{DA\_1}$, $S_{CL\_1}$, ..., $S_{DA\_N}$, $S_{CL\_N}$ respectively. Even if the ground level of the signals $S_{DA}$, $S_{CL}$ is different from the ground level of the signals $S_{DA\_1}$, $S_{CL\_1}$ ... $S_{DA\_N}$, $S_{CL\_N}$, the signals $S_{DA}$ and $S_{CL}$ still can communicate with the signals $S_{DA\_1}$, $S_{CL\_1}$ ..., $S_{DA\_N}$, $S_{CL\_N}$ through circuits 10, 20, ..., 30 and capacitors 40, 45, ..., 50, 55.

Figure 2:
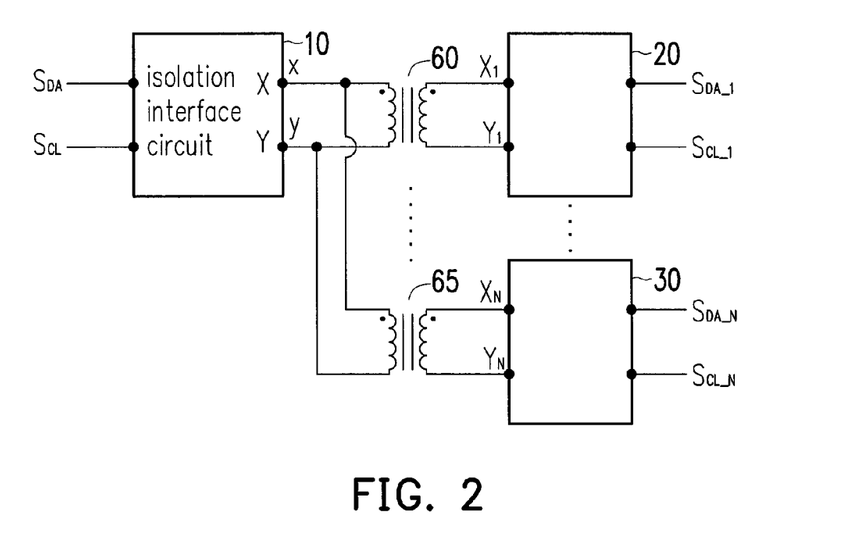
FIG. 2 shows a schematic view illustrating a second embodiment of an isolation interface circuit for power management according to the present invention.

FIG. 2 shows a schematic view illustrating a second embodiment of an isolation interface circuit for power management according to the present invention, in which capacitors 40, 45 and capacitors 50, 55 in FIG. 1 are replaced by small pulse transformers 60 and 65 in FIG. 2. The pulse transformers 60 and 65 can provide high isolation.

Figure 3:
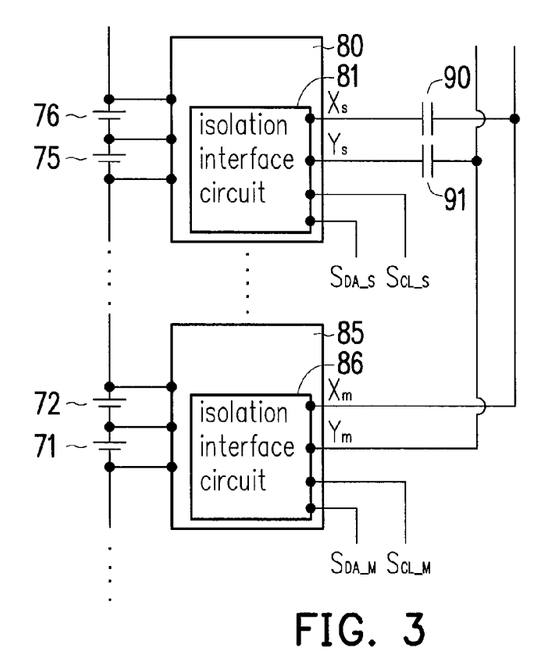
FIG. 3 shows a block diagram illustrating a third embodiment of an isolation interface circuit for power management according to the present invention.

FIG. 3 shows a block diagram illustrating a third embodiment of an isolation interface circuit for power management according to the present invention. It is applied to a battery management system, such as battery cell-voltage monitor, cell balance charge/discharge and battery protections, etc. Battery cells 71 to 76 are connected in series and are coupled to a slave battery controller 80 and a master battery controller 85 respectively. The ground level of the master battery controller 85 is different from the ground of the slave battery controller 80. The master battery controller 85 comprises an isolation interface circuit 86 coupled to the serial interface signals $S_{DA\_M}$ and $S_{CL\_M}$. The isolation interface circuit 86 generates signals $x_m$ and $y_m$ correlating to signals $x_s$, $y_s$ of an isolation interface circuit 81. The master controller 85 is coupled to the slave controller 80 through capacitors 90 and 91. The isolation interface circuit 81 of the slave battery controller 80 also correlates to the serial interface signals $S_{DA\_S}$, and $S_{CL\_S}$. The battery management circuit 86 is able to communicate with the battery management circuit 81 through a pair of capacitors 90 and 91. Although the ground level of the master battery controller 85 is different from the ground level of the slave battery controller 80, the serial interface signals $S_{DA\_M}$, $S_{CL\_M}$ can still communicate with the serial interface signals $S_{DA\_S}$, $S_{CL\_S}$. The isolation interface circuits 81 and 86 have the same function as the circuit 10 shown in FIG. 1 and FIG. 2.

Figure 4:
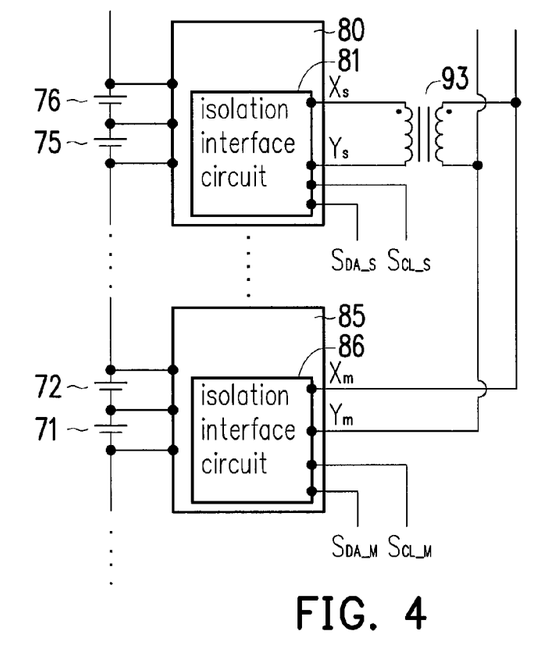
FIG. 4 shows a schematic view illustrating a fourth embodiment of an isolation interface circuit for power management according to the present invention.

FIG. 4 shows a schematic view illustrating a fourth embodiment of an isolation interface circuit for power management according to the present invention, wherein a small pulse transformer 93 is used for replacing the capacitors 90 and 91 shown in FIG. 3. The battery management circuit 86 can communicate with the battery management circuit 81 through the transformer 93.

Figure 5:
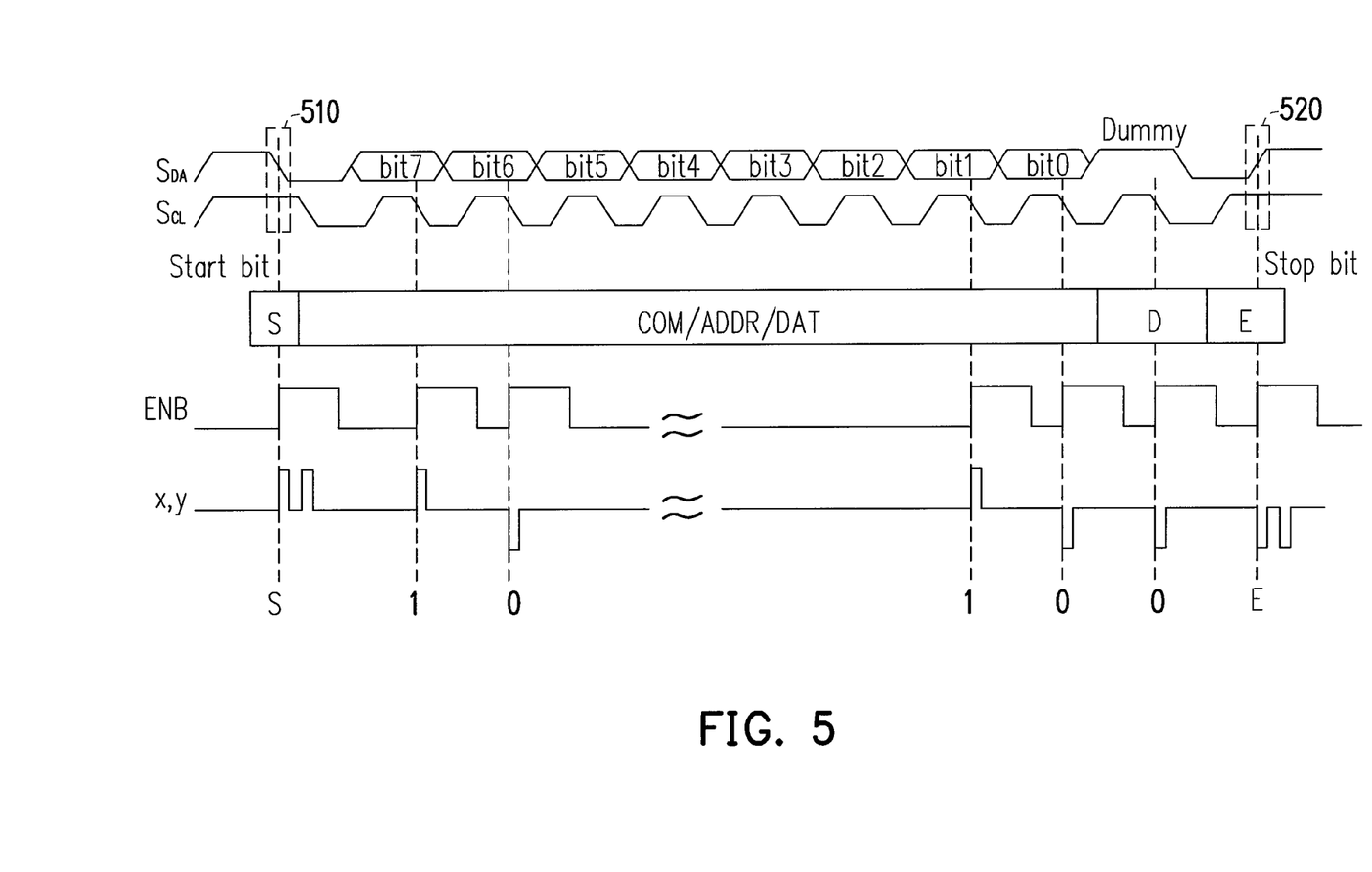
FIG. 5 shows waveforms of signals $S_{DA}$, $S_{CL}$, x, y and ENB according to the present invention.

FIG. 5 shows waveforms of signals $S_{DA}$, $S_{CL}$, x, y and ENB according to the present invention. The waveforms represent the information transferred from the signals $S_{DA}$, $S_{CL}$ to the signals x, y. The circuit 10 in FIG. 1 and FIG. 2 generates signals x, y and ENB in response to the input of the serial interface signals $S_{DA}$, $S_{CL}$. When the signal ENB is enabled (logic high), the terminals X and Y have low output impedance, and to the contrary, the terminals X and Y have high output impedance when the signal ENB is disabled (logic low). The signal ENB is a pulse signal with a specific period, for example, less than 2 micro seconds. The serial interface signals $S_{DA}$ and $S_{CL}$ comprise information in a frame having a start bit S and a stop bit E. The information of the serial interface signals $S_{DA}$ and $S_{CL}$ could comprise commands (COM), addresses (ADDR) or data (DAT) between the start bit (S) and the stop bit (E). A dummy bit D is set between the information of the serial interface signals $S_{DA}$ and $S_{CL}$ and the stop bit (E). In normal conditions, the signals $S_{DA}$ and $S_{CL}$ remain in a logic-high state. The start bit S is identified when the signal $S_{CL}$ remains in a logic-high state and the signal $S_{DA}$ changes to a logic-low state (numeral 510). The stop bit E is identified when the signal $S_{CL}$ remains in a logic-high state and the signal $S_{DA}$ changes to a logic-high state (numeral 520). The information (for example, command (COM), address (ADDR) or data (DAT)) of the signal $S_{DA}$ can be attained during a period of the signal $S_{CL}$ which shows a logic-low state to a logic high state. The information of the signal $S_{DA}$ can only be changed during the signal $S_{CL}$ is in a logic-low state.

The circuit 10 generates the signal ENB in response to enabling of the start bit (S), the stop bit (E) and the information. The signals x and y are differential polarity pulse signals. During a specific period (the enabling period of the signal ENB), the polarity of the pulse signals x and y represents a logic-high or logic-low state. During the enabling period of the signal ENB, the number associating the polarity of the pulse signals x and y represents the start bit (S), the stop bit (E) or the information (such as "1", "0", "1", "0", "0" presented in FIG. 5).

For example, during the enabling period of the signal ENB, two positive polarity pulses in signals x and y indicate the start bit (S). During the enabling period of the signal ENB, two negative polarity pulses in signals x and y indicate the stop bit (E). Only one pulse generated during the enabling period of the signal ENB in signals x and y represents the information; the positive polarity pulse (such as "1" in FIG. 5) represents a logic-high state, and the negative polarity pulse (such as "0" in FIG. 5) represents a logic-low state.

Figure 6:
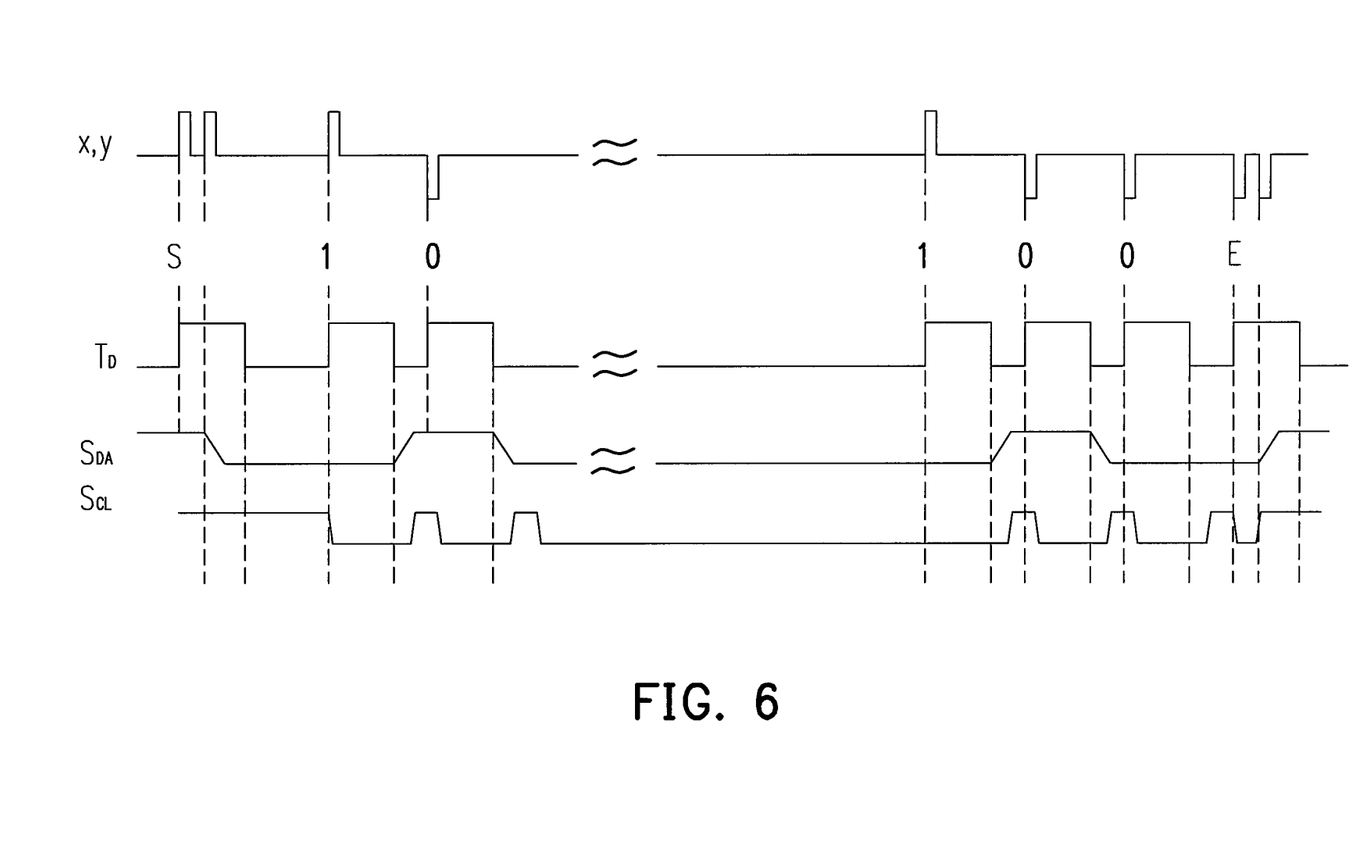
FIG. 6 shows waveforms of signals $S_{DA}$, $S_{CL}$, x, y and a signal $T_D$ according to the present invention.

FIG. 6 shows waveforms of signals $S_{DA}$, $S_{CL}$, x, y and a signal $T_D$ according to the present invention, which shows information transferring from the signals x, y to the signals $S_{DA}$, and $S_{CL}$. The signal $T_D$ is a time delay signal that provides a time frame and a specific period to identify the pulse amount of the signals x and y. The circuit 10 in FIG. 1 and FIG. 2 generates signals $S_{DA}$, $S_{CL}$ and $T_D$ in response to input of the signals x and y.

The circuit 10 generates the signal $T_D$ in response to the enabling of the signals x and y. During the specific period (the enabling period of the signal $T_D$), the polarity of the pulse signals x and y represents the logic-high state or the logic-low state. During the specific period (the enable period of the signal $T_D$), the amount of the pulse signals x and y which is associated the polarity, represents the start bit (S), the stop bit (E) or the information ("1", "0", "1", "0", "0" presented in FIG. 6).

For example, during the enabling period of the signal $T_D$:

(1) Two positive polarity pulses indicate the start bit (S). The circuit 10 generates the start bit timing sequence for the signals $S_{DA}$ and $S_{CL}$. The signal $S_{CL}$ remains in logic-high when the signal $S_{DA}$ becomes into logic-low. The signal $S_{DA}$ will be in logic-low when the second positive polarity pulse of the signals x, y is detected.

(2) Two negative polarity pulses indicate the stop bit (E). The circuit 10 generates the stop bit timing sequence for the signals $S_{DA}$, $S_{CL}$. The signal $S_{CL}$ remains in logic-high and the signal $S_{DA}$ becomes into logic-high. The signal $S_{DA}$ will be logic-high when the second negative polarity pulse of the signals x, y is detected.

(3) Other detected polarity pulses represent the information. When one positive polarity pulse of the polarity pulses is in logic-high, the negative polarity pulse of the polarity pulses is in logic low. The circuit 10 generates the information for the signals $S_{DA}$ and $S_{CL}$. The information of the signal $S_{DA}$ is generated or alternated in response to a falling edge of the signal $T_D$. The signal $S_{CL}$, remains in a logic-low state when the information of the signal $S_{DA}$ is generated or alternated. The circuit 10 generates a clock pulse (for example, a period from low to high and from high to low) for the signal $S_{CL}$ when the signal $S_{DA}$ is settled and during the logic low period of the signal $T_D$.

Figure 7:
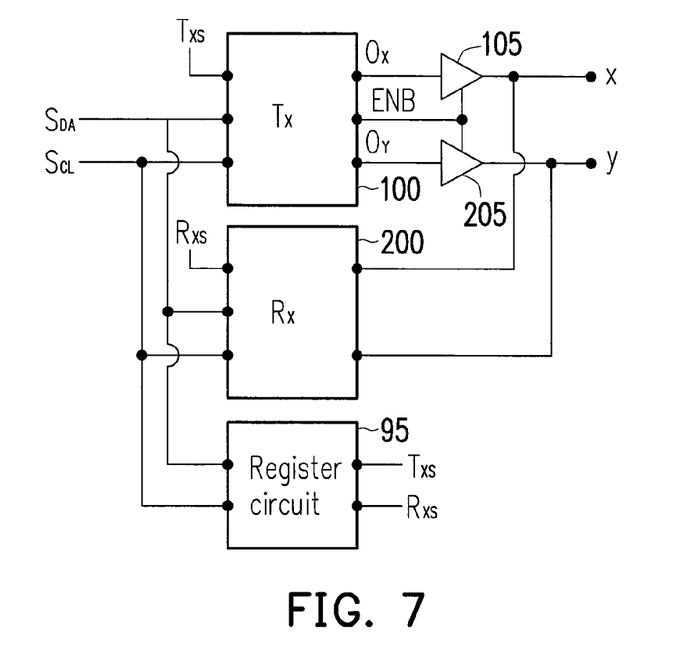
FIG. 7 shows a block diagram illustrating one embodiment of an isolation interface circuit according to the present invention.

FIG. 7 shows a block diagram illustrating one embodiment of an isolation interface circuit according to the present invention, such as the circuits 10, 20, 30, 81, and 86 in FIGS. 1-4. A register circuit 95 is configured to receive the serial interface signals $S_{DA}$ and $S_{CL}$, for generating latched signals $T_{XS}$, and $R_{XS}$. The signal $T_{XS}$ is configured to enable a transmitter ($T_X$) 100 for transferring the data from the serial interface (the signals $S_{DA}$, and $S_{CL}$) to the isolation interface (the signals x and y). In other words, the transmitter 100 receives the signal $S_{DA}$ and $S_{CL}$ for generating differential polarity pulse signals x, y in response to the signal $S_{DA}$ and $S_{CL}$. The transmitter 100 can be regarded as a transmitting circuit, and the signal $S_{DA}$ and $S_{CL}$ can be regarded as a first serial interface signal and a second serial interface signal. The signal $R_{XS}$ is configured to enable a receiver ($R_X$) 200 for transferring the data from the isolation interface (the signals x and y) to the serial interface (the signals $S_{DA}$ and $S_{CL}$). In other words, the receiver 200 receives the differential polarity pulse signals x, y for generating the signal $S_{DA}$ and $S_{CL}$ in response to the differential polarity pulse signals x, y. The receiver 200 can be regarded as a receiving circuit. The transmitter 100 generates signals $O_X$, $O_Y$ and ENB in response to input signals $S_{DA}$, $S_{CL}$ and $T_{XS}$ of the transmitter 100. The signals $O_X$, $O_Y$, and ENB are configured to generate signals x and y through tri-state buffers 105 and 205. The tri-state buffers 105 and 205 have high-impedance outputs when the signal ENB is disabled (in a logic-low state). The receiver 200 generates the signals $S_{DA}$ and $S_{CL}$ in response to the signals X, Y and $R_{XS}$. The output of the signals $S_{DA}$ and $S_{CL}$ are open-drain (open collector) signal and pulled high by resistors. Therefore, to parallel connect the signals $S_{DA}$ and $S_{CL}$ with other serial interface signals is practicable. That is to say, the signal $S_{DA}$ (the first serial interface signal) can be parallel connected to another signal $S_{DA}$ of another isolation interface circuit; and the signal $S_{CL}$ (the second serial interface signal) can be parallel connected to another signal $S_{CL}$ of another isolation interface circuit. The differential polarity pulse signals x, y can be parallel connected to another differential polarity pulse signal of another isolation interface circuit through a pair of capacitors or a transformer. Only one of the transmitter 100 and the receiver 200 can be enabled by the signals $T_{XS}$ and $R_{XS}$ in one period.

Figure 8:
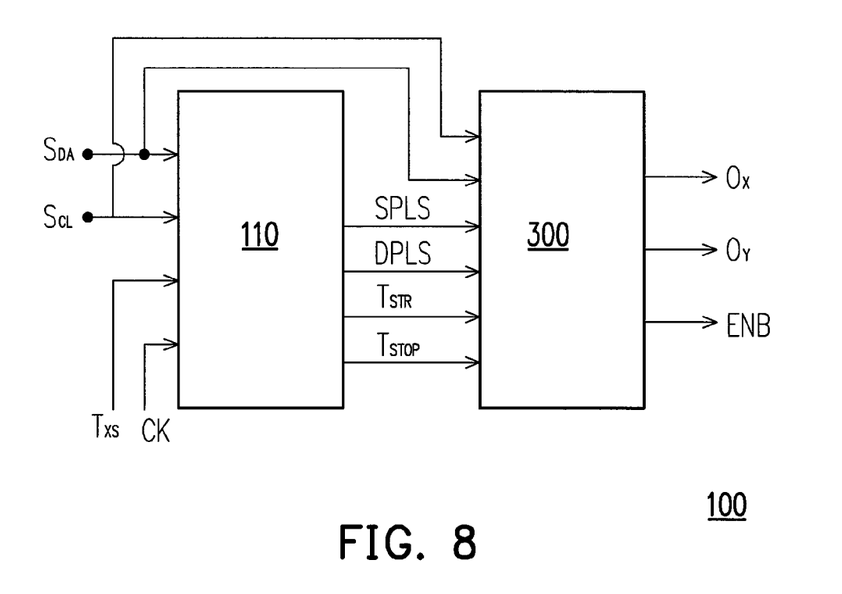
FIG. 8 shows a block diagram illustrating the transmitter in FIG. 7.

FIG. 8 shows a block diagram illustrating another embodiment of the transmitter 100 of the present application. A circuit 110 is configured to receive the signals $S_{DA}$, $S_{CL}$, $T_{XS}$ and a clock signal CK for generating a start signal $T_{STR}$, a stop signal $T_{STOP}$ and pulses signals SPLS, DPLS. The start signal $T_{STR}$ represents the start bit (S) is detected in the serial interface (the signals $S_{DA}$, $S_{CL}$). The stop signal $T_{STOP}$ represents the stop bit (E) is detected in the serial interface (the signals $S_{DA}$, $S_{CL}$). The circuit 110 will generate two pulses for the signal DPLS in response to the detection of the start bit (S) and the stop bit (E) of the serial interface (the signals $S_{DA}$, $S_{CL}$). The circuit 110 will generate one pulse for the signal SPLS in response the signal $S_{CL}$ when the start signal $T_{STR}$ is enabled. A circuit 300 generates the signals $O_X$, $O_Y$, ENB in response to the signals $S_{DA}$, $S_{CL}$, SPLS, DPLS, $T_{STR}$, $T_{STOP}$.

Figure 9:
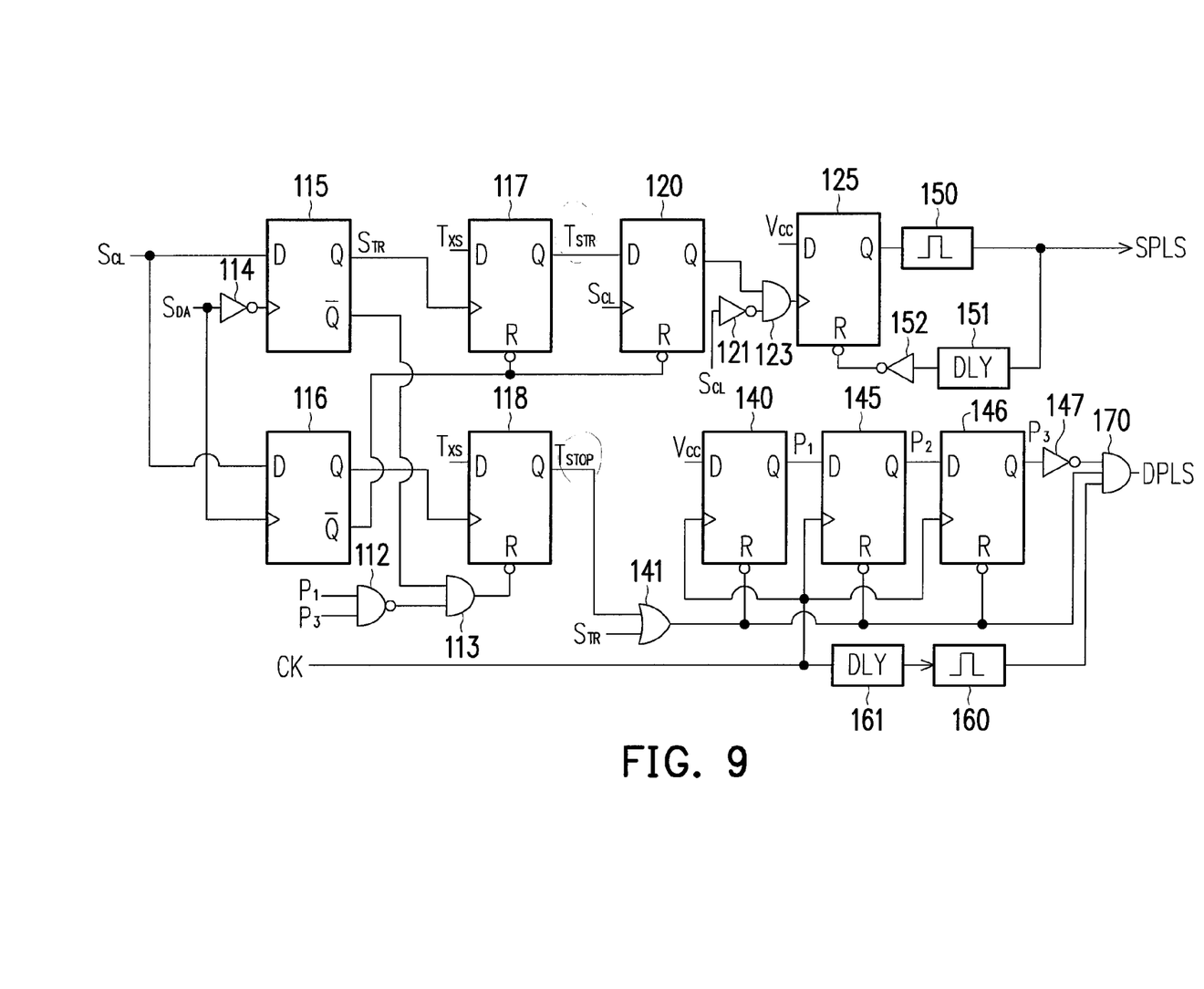
FIG. 9 shows a block diagram illustrating the circuit 110 in FIG. 8.

FIG. 9 shows a block diagram illustrating the circuit 110 in FIG. 8. Flip-flops 115, 116, 117, 118 and inverter 114 are applied to enable the signals $T_{STR}$, $T_{STOP}$ according to the signals $S_{DA}$, $S_{CL}$, and $T_{XS}$. The start signal $T_{STR}$ will be reset when the stop signal $T_{STOP}$ is enabled. The stop signal $T_{STOP}$ will be reset when the start signal $T_{STR}$ is enabled or the signal DPLS (two pulses) is generated. An NAND gate 112 and an AND gate 113 is configured to reset and disable the stop signal $T_{STOP}$ according to signals $P_1$, $P_2$ and an inverted output signal of flip-flop 115. A signal $S_{TR}$ is the output of a flip-flop 115. An OR gate 141, an inverter 147, an AND gate 170, a pulse generator 160, a time-delay circuit (DLY) 161 and flip-flops 140, 145, 146 are utilized to generate the signal DPLS in response the enable of the signal $T_{STR}$, $T_{STOP}$ and the clock signal CK. The pulse generator 160 is configured to receive the clock signal CK via the time-delay circuit (DLY) 161 for generating the pulse signals have the pulse width shorter than 300 nsec. Signals $P_1$, $P_2$ and $P_3$ are output by flip-flops 140, 145 and 146 respectively.

An AND gate 123, a time-delay circuit (DLY) 151, a pulse generator 150, inverters 121, 152 and flip-flops 120, 125 are applied to generate the signal SPLS in response the signals $T_{STR}$ and $S_{CL}$. When the start signal $T_{STR}$ is enabled, a rising edge following a falling edge of the signal $S_{CL}$, will generate one pulse for the signal SPLS via the pulse generator 150. The pulse width of the signal SPLS is shorter than 300 nsec.

Figure 10:
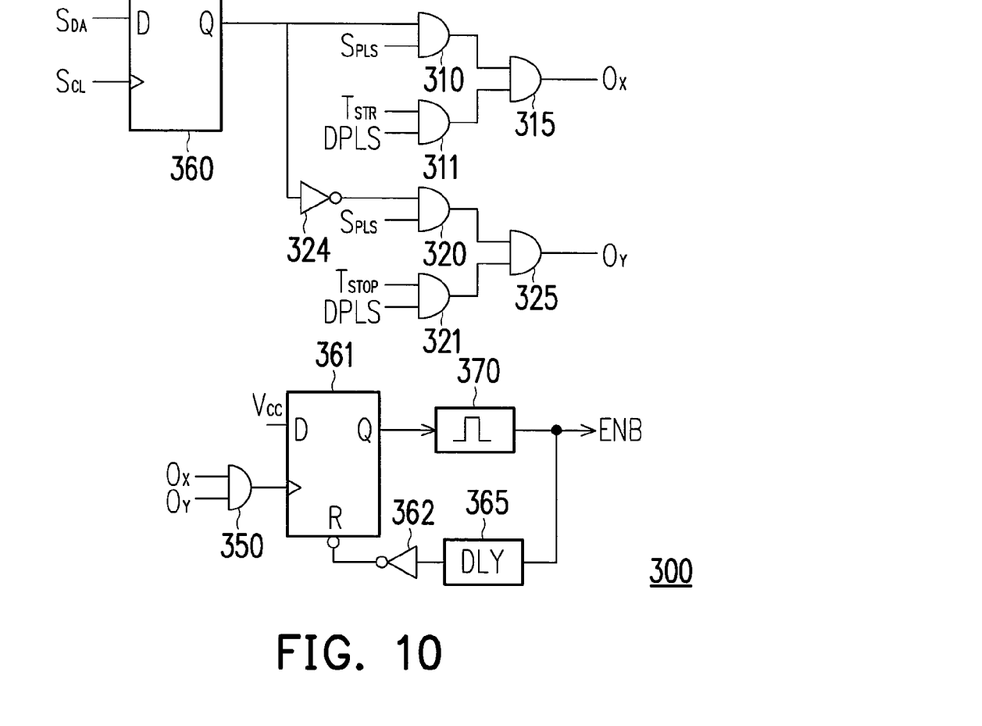
FIG. 10 shows a block diagram illustrating the circuit 300 in FIG. 8.

FIG. 10 shows a block diagram illustrating the circuit 300 in FIG. 8. A flip-flop 360 is utilized to latch the data of serial interface (signals $S_{DA}$, $S_{CL}$). An OR gate 315, AND gates 310, 311 generate signal $O_X$ in response the signals SPLS, DPLS, $T_{STR}$ and an output of the flip-flop 360. When the start signal $T_{STR}$ is enabled, the signal $O_X$ will have two pulses in accordance with the signal DPLS. After that, the signal $O_X$ will have one pulse in accordance with the signal SPLS when the data (the output of the flip-flop 360) is the logic-high. An OR gate 325, an inverter 324, AND gates 320, 321 generate signal $O_Y$ in response the signals SPLS, DPLS, $T_{STOP}$ and the output of the flip-flop 360. When the stop signal $T_{STOP}$ is enabled, the signal $O_Y$ will have two pulses in accordance with the signal DPLS. For the data transfer, the signal $O_Y$ will have one pulse in accordance with the signal SPLS when the data (the output of the flip-flop 360) is the logic-low. An OR gate 350, a flip-flop 361, an inverter 362, a time-delay circuit 365 and a pulse generator 370 will generate the signal ENB when the signals $O_X$ or $O_Y$ is generated. The pulse width of the pulse signal of the pulse generator 370 is shorter than 2 µsec, for example.

Figure 11:
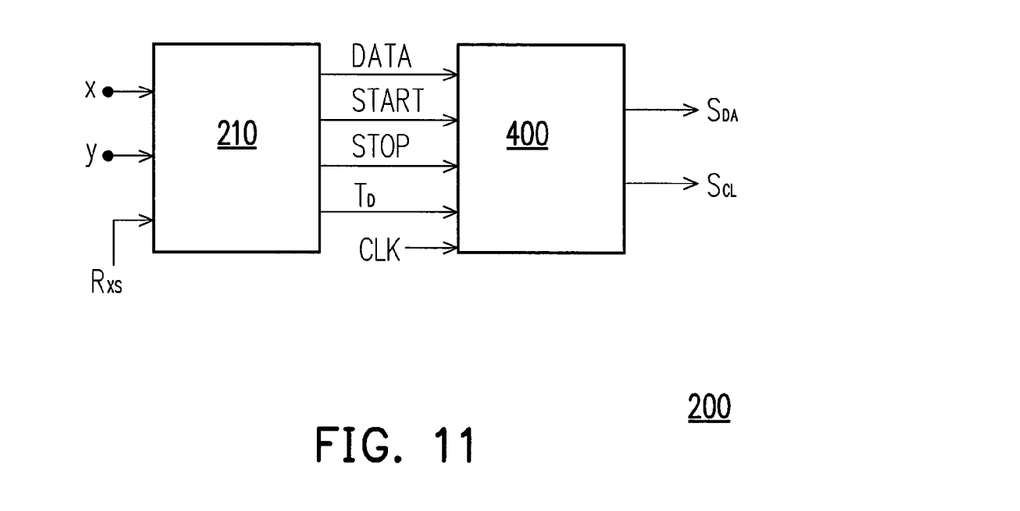
FIG. 11 shows a block diagram illustrating the receiver 200 in FIG. 7.

FIG. 11 shows a block diagram illustrating the receiver 200 in FIG. 7. A circuit 210 is configured to receive the signals x, y and $R_{XS}$ for generating signals DATA, START, STOP, and $T_D$. The signal DATA represents information such as command (COM), address (ADDR) or data (DAT) in FIG. 5. The signal START means a start bit (S) is detected. The signal STOP means a stop bit (E) is detected. The signal $T_D$ shows "the enabling period" for detecting the signals x, y. A circuit 400 is utilized to generate the serial interface signals $S_{DA}$, $S_{CL}$ in response to the signals DATA, START, STOP, $T_D$ and a clock signal CLK.

Figure 12:
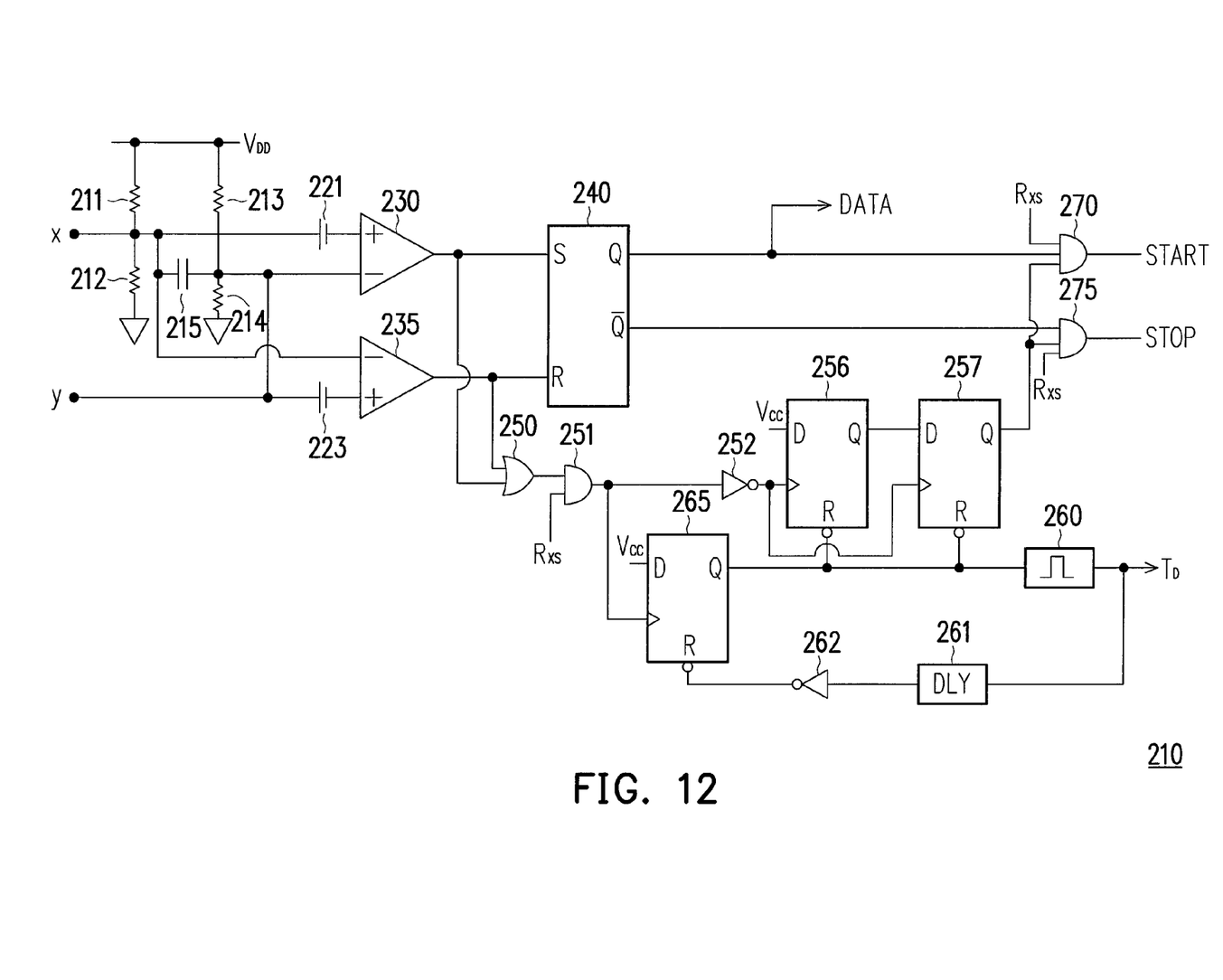
FIG. 12 shows a block diagram illustrating the circuit 210 in FIG. 11.

FIG. 12 shows a block diagram illustrating the circuit 210 in FIG. 11. Resistors 211, 212, 213, and 214 provide a bias and input impedance for the receiver 200 to detect the signals x, y. A capacitor 215 associated with resistors 211, 212, 213, and 214 develop a low-pass filter for detecting the signals x, y. A comparator 230 is configured to receive the signals x, y for the set of a flip-flop 240 if the amplitude of the signal x is higher than "the signal y plus a threshold 221. A comparator 235 is configured to receive the signals x, y for the reset of the flip-flop 240 if the amplitude of the signal y is higher than "the signal x plus a threshold 223. The flip-flop 240 generates the signal DATA. The signal DATA shows the polarity of the signals x, y. When the signal $R_{XS}$ is enabled, an OR gate 250, inverters 252, 262, a pulse generator 260, a time-delay circuit 261, AND gates 251, 270, 275 and flip-flops 256, 257, and 265 generate signals START and STOP in response to the signals x, y. The pulse generator 260 generates the signal $T_D$ in response to the output of the comparators 230 and 235. The pulse width of the signal $T_D$ is shorter than 2 µsec. If there are two positive polarity pulses generated during the enabling period of the signal $T_D$, then the signal START is enabled. If there are two negative polarity pulses generated during the enabling period of the signal $T_D$, then the signal STOP is enabled.

Figure 13:
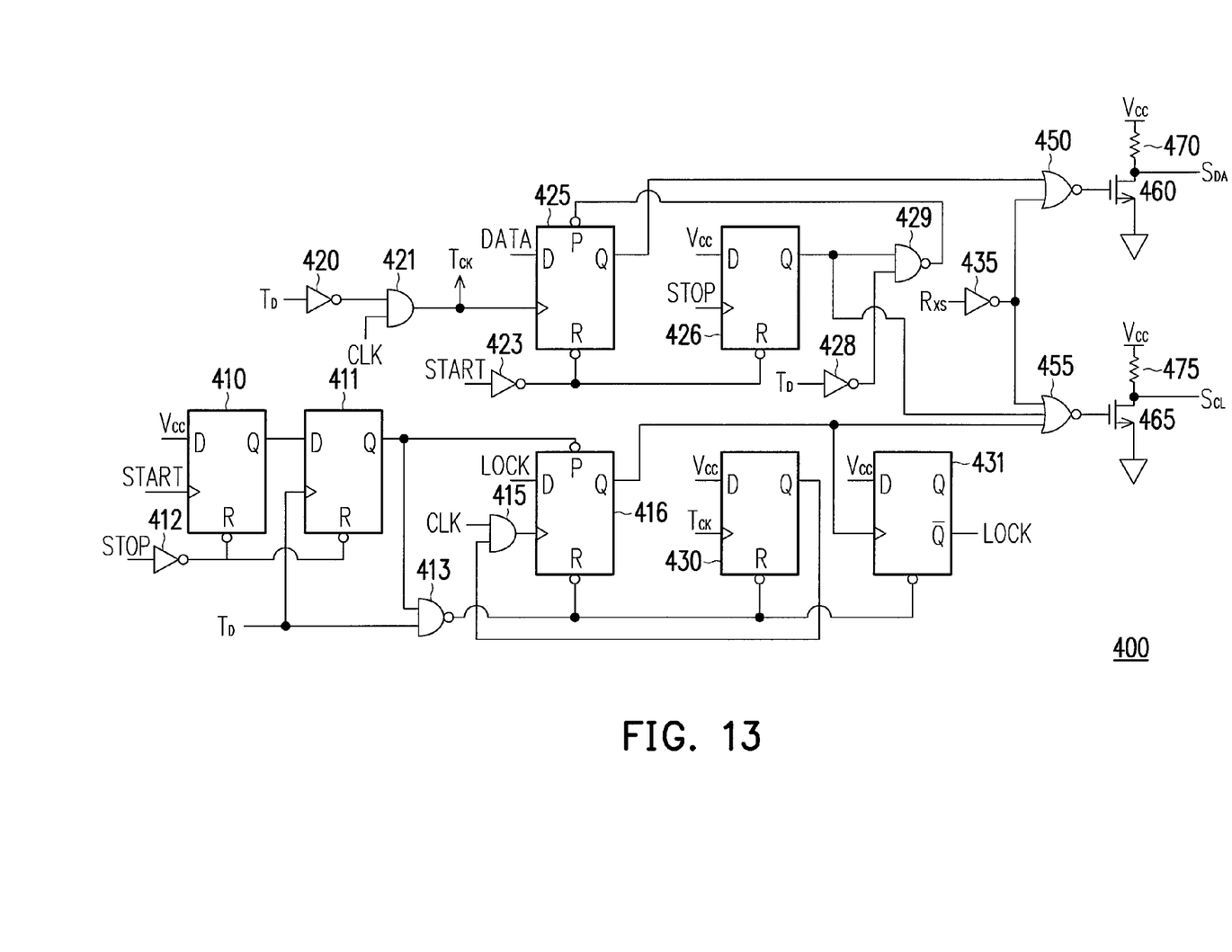
FIG. 13 shows a block diagram illustrating the circuit 400 in FIG. 11.

FIG. 13 shows a block diagram illustrating the circuit 400 in FIG. 11. When the signal $R_{XS}$ is enabled, flip-flops 410, 411, 425 inverters 412, 423, 435, NOR gates 450, 455, transistors 460, 465 and an NAND gate 413 generate the start bit (S) sequence (the signals $S_{DA}$, $S_{CL}$) in response to the signals START, STOP and $T_D$. When the signal START is enabled, flip-flop 425, and 426 are reset and the signal $S_{DA}$ becomes logic-low immediately. After that, the flip-flop 411 is enabled to reset flip-flops 416, 430 in response to the rising edge of the signal $T_D$. The reset of the flip-flop 416 will set the signal $S_{CL}$ to the logic-low via the NOR gate 455 and the transistor 465.

The logic-low period of the signal $T_D$ associates with the clock signal CLK generate a signal $T_{CK}$ via an inverter 420 and an AND gate 421. The signal $T_{CK}$ is configured to latch the signal DATA to the flip-flop 425. The output of the flip-flop 425 will determine the state of the signal $S_{DA}$ via the NOR gate 450 and the transistor 460. Meanwhile, the signal $T_{CK}$ will enable the flop-flop 430. The output of the flip-flop 430 associates with the clock signal CLK (via an AND gate 415)

will trigger the flip-fop 416 to set the signal $S_{CL}$, to be the logic-high. After the signal $S_{CL}$ becomes the logic-high, the signal $S_{CL}$ will be clocked to the logic-low in the next clock-cycle of the clock signal CLK via a flip-flop 431. The flip-flop 431 generates a signal LOCK configured to alternate the state of the flip-flop 416.

When the signal STOP is enabled, the flip-flop 426 will be enabled to set the signal $S_{CL}$ to logic-high immediately via the NOR gate 455. Meanwhile, the flip-flops 410, 411 are rest. After that, when the signal $T_D$ becomes the logic-low, the flip-flop 425 will be preset via an inverter 428 and a NAND gate 429. The preset of the flip-flop 425 will enable the signal $S_{DA}$ to be the logic-high. Resistors 470 and 475 are utilized to pull high the signals $S_{DA}$ and $S_{CL}$ respectively.

Figure 14:
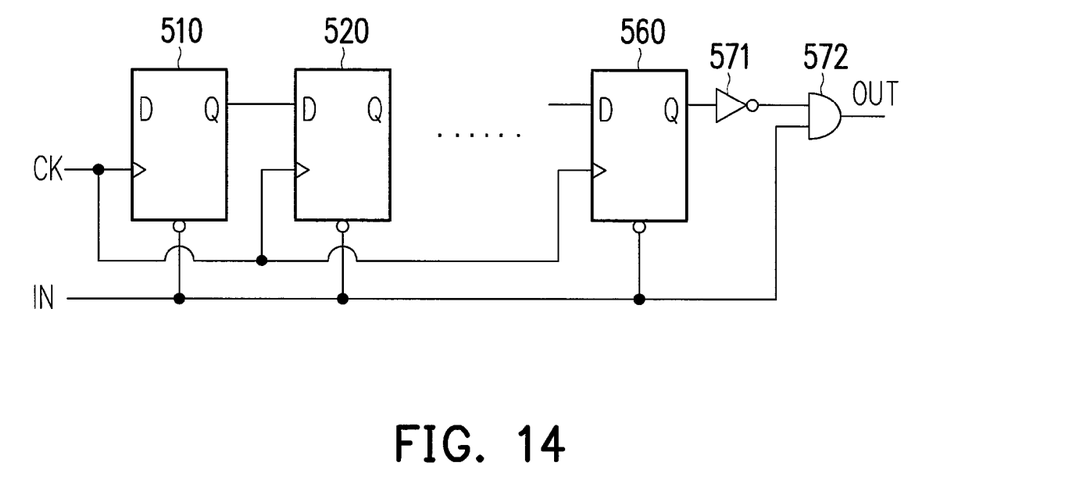
FIG. 14 is a reference circuit of the pulse generator in FIG. 10 and FIG. 12.

FIG. 14 is a reference circuit of the pulse generator in FIG. 10 and FIG. 12 (i.e., the pulse generator 370 in FIG. 10 and the pulse generator 260 in FIG. 12). Flip-flops 510, 520, and 560, inverter 114, and AND gate 572 are applied to generate an output signal OUT according to an input signal IN and the clock signal CK. The pulse width of the output signal OUT generated by the pulse generator is shorter than 2 μsec.

Figure 15:
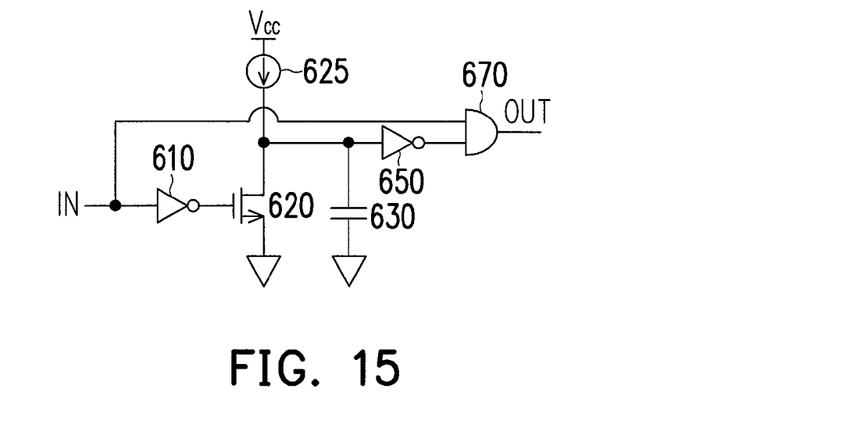
FIG. 15 is a reference circuit of the pulse generator in FIG. 9.
Figure 16:
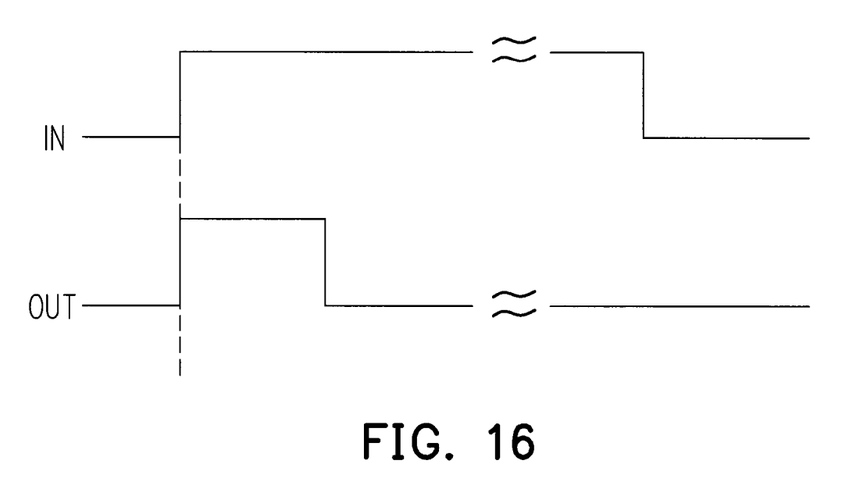
FIG. 16 shows the waveforms for the pulse generator in accordance with the present invention.

FIG. 15 is a reference circuit of the pulse generator in FIG. 9 (i.e., the pulse generator 150 and 160). An NMOS transistor 620, a current source 625, a capacitor 630, inverters 610, 650 and AND gate 670 are applied to generate an output signal OUT according to an input signal IN and a power voltage $V_{CC}$. The current source 625 is coupled between a drain terminal of the NMOS transistor 620 and the power voltage $V_{CC}$. An input node of the inverter 610 receives the input signal IN, and a output node of the inverter 610 is coupled to a gate terminal of the NMOS transistor 620. The capacitor 630 is coupled between the drain terminal of the NMOS transistor 620 and a ground. The inverter 650 is coupled between the drain terminal of the NMOS transistor 620 and a first input node of the AND gate 670. A second input node of the AND gate 670 receives the input signal IN, and an output node of the AND gate 670 generates the output signal OUT. FIG. 16 shows the waveforms for the pulse generator in accordance with the present invention. In FIG. 16, the output signal OUT is enabled during a period of time when the input signal IN is changed from logic-low to logic-high.

Although the present invention and the advantages thereof have been described in detail, it should be understood that various changes, substitutions, and alternations can be made therein without departing from the spirit and scope of the invention as defined by the appended claims. That is, the discussion included in this invention is intended to serve as a basic description. It should be understood that the specific discussion may not explicitly describe all embodiments possible; many alternatives are implicit. The generic nature of the invention may not fully explained and may not explicitly show that how each feature or element can actually be representative of a broader function or of a great variety of alternative or equivalent elements. Again, these are implicitly included in this disclosure. Neither the description nor the terminology is intended to limit the scope of the claims.

What is claimed is:

1. An isolation interface circuit, comprising:
   a transmitting circuit configured to receive a first serial interface signal and a second serial interface signal for generating a differential polarity pulse signal; and
   a receiving circuit configured to receive the differential polarity pulse signal for generating the first serial interface signal and the second serial interface signal;
   wherein the differential polarity pulse signal is generated in response to the first serial interface signal and the second serial interface signal; the first serial interface signal and the second serial interface signal are generated in accordance with the differential polarity pulse signal; in a period, only one of the transmitting circuit and the receiving circuit can be enabled,
   in which the first serial interface signal and the second serial interface signal develop a frame including a start bit, a stop bit and data.

2. The circuit as claimed in claim 1, in which the differential polarity pulse signal develop a frame includes a start signal, a stop signal and data signal.

3. The circuit as claimed in claim 1, in which the polarity of the differential polarity pulse signal represents the logic-high or the logic-low.

4. The circuit as claimed in claim 1, in which a number of the differential polarity pulse signal in a specific period represents the start signal, the stop signal or the data signal.

5. The circuit as claimed in claim 1, in which a number and a polarity of the differential polarity pulse signal in a specific period represent the start signal or the stop signal.

6. The circuit as claimed in claim 1, in which the first serial interface signal can be parallel connected to another first serial interface signal of another isolation interface circuit; and the second serial interface signal can be parallel connected to another second serial interface signal of another isolation interface circuit.

7. The circuit as claimed in claim 1, in which the differential polarity pulse signal can be parallel connected to another differential polarity pulse signal of another isolation interface circuit through a pair of capacitors.

8. The circuit as claimed in claim 1, in which the differential polarity pulse signal can be parallel connected to another differential polarity pulse signal of another isolation interface circuit through a transformer.

9. The circuit as claimed in claim 1, in which the isolation interface circuit is utilized in a battery management system.

10. The circuit as claimed in claim 1, in which the isolation interface circuit is utilized in a battery management circuit; the first battery management circuit can communicate with the second battery management circuit through a pair of capacitors.

11. The circuit as claimed in claim 1, in which the isolation interface circuit is utilized in a battery management circuit; the first battery management circuit can communicate with the second battery management circuit through a transformer.

12. The circuit as claimed in claim 1, in which the pulse width of the differential polarity pulse signal is shorter than 300 nsec.

13. The circuit as claimed in claim 1, in which the output of the differential polarity pulse signal is only enabled within a specific time; after the specific time, the output of the differential polarity pulse signal become a high impedance.

14. The circuit as claimed in claim 1, in which an input node of the differential polarity pulse signal is coupled to an output node of a low-pass filter.

* * * * *